US007095078B2

(12) United States Patent
Verhoeven

(10) Patent No.: US 7,095,078 B2
(45) Date of Patent: Aug. 22, 2006

(54) CHARGE TRAPPING MEMORY CELL

(75) Inventor: Martin Verhoeven, Radebeul (DE)

(73) Assignee: Infineon Technologies AG, Munich (DE)

( * ) Notice: Subject to any disclaimer, the term of this patent is extended or adjusted under 35 U.S.C. 154(b) by 13 days.

(21) Appl. No.: 10/954,156

(22) Filed: Sep. 29, 2004

(65) Prior Publication Data
US 2005/0105361 A1 May 19, 2005

(30) Foreign Application Priority Data
Sep. 30, 2003 (DE) ................. 103 45 520

(51) Int. Cl.
H01L 29/792 (2006.01)
(52) U.S. Cl. ...................... 257/324; 257/316
(58) Field of Classification Search ............... 257/316, 257/324
See application file for complete search history.

(56) References Cited
U.S. PATENT DOCUMENTS
6,400,610 B1 * 6/2002 Sadd ..................... 365/185.29
6,813,188 B1 * 11/2004 Ohtani .................. 365/185.18
2003/0025148 A1 * 2/2003 Hsieh et al. ................ 257/315
2003/0062567 A1 * 4/2003 Zheng et al. ............... 257/316

FOREIGN PATENT DOCUMENTS
WO WO 03/030264 A1 4/2003

OTHER PUBLICATIONS
Korotkov A, et al., "Resonant Fowler-Nordhelm Tunneling through Layered Tunnel Barriers and its Possible Applications," Techn. Dig. IDEM 1999, pp. 223-226.
Casperson J, et al., "Materials issues for layered tunnel barrier structures," Journal of Applied Physics, vol. 92, No. 1, Jul. 1, 2002, pp. 261-267.
Lusky, E., et al., "Electrons Retention Model for Localized Charge in Oxide-Nitride-Oxide (ONO) Dielectric," IEEE Electron Device Letters, vol. 23, No. 9, Sep. 2002, pp. 556-558.

* cited by examiner

Primary Examiner—Andy Huynh
(74) Attorney, Agent, or Firm—Slater & Matsil L.L.P.

(57) ABSTRACT

In a charge trapping memory cell, programming occurs by trapping hot electrons from the channel region in a storage layer. The erasure occurs by Fowler-Nordheim tunneling of the electrons through the lower boundary layer to source or drain or preferably through the upper boundary layer into the gate electrode. The boundary layers are preferably aluminum oxide.

18 Claims, 2 Drawing Sheets

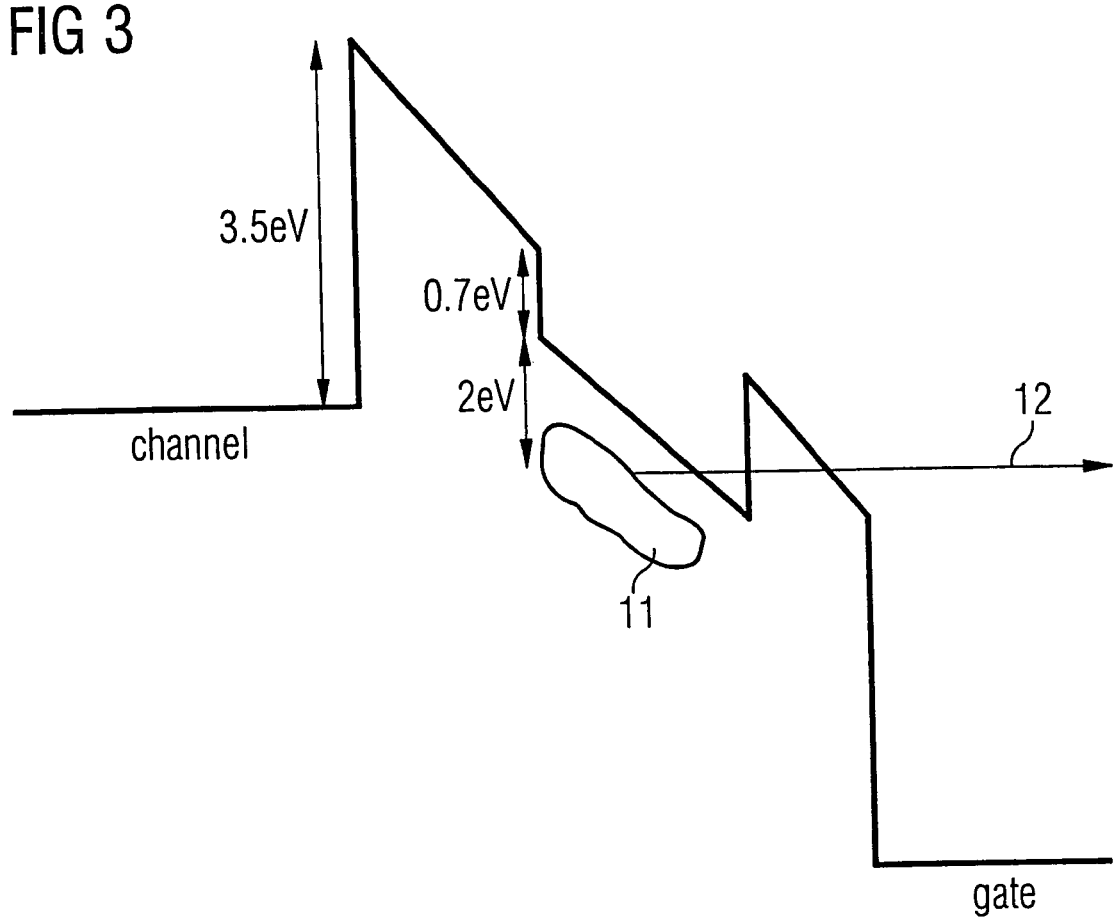

CHARGE TRAPPING MEMORY CELL

This application claims priority to German Patent Application 103 45 520.5, which was filed Sep. 30, 2003 and is incorporated herein by reference.

TECHNICAL FIELD

The present invention relates generally to a memory cell, and more particularly to a charge trapping memory cell and a method for operating a charge trapping memory cell.

BACKGROUND

A charge trapping memory cell comprises a channel region between regions of source and drain, above which a gate electrode is arranged. A storage layer sequence, which usually contains a nitride layer between boundary layers made of oxide, is situated as gate dielectric between the channel region and the gate electrode. Hot electrons from the channel (channel hot electrons, CHE) are trapped in the storage layer during the programming of the charge trapping memory cell. The electrons in the channel are accelerated from source to drain in order to program a bit in the storage layer made of nitride above the drain region. If the polarity of the electrical voltage applied between source and drain for this purpose is reversed, a bit can likewise be programmed in the storage layer above the source region. In this way, it is possible to store two bits of information in each of these memory cells. The electrons remain localized in the nitride layer, so that the memory cell is nonvolatile.

In order to erase the memory cell, the charge present in the storage layer is compensated for by hot holes injected into the storage layer from the channel. In this case, the problem arises that owing to the different mobilities and masses of the different charge carriers, the distributions of the electrons and holes in the storage layer do not correspond after the erasure process. The position of the holes is concentrated to a greater extent, and the center thereof is displaced somewhat with respect to the center of the electron distribution. As a result, the number of possible programming/erasure cycles is considerably reduced.

If, instead of injecting hot holes into the storage layer, provision is made for forcing the electrons back from the storage layer into the channel region or to source or drain, a negative potential must be applied to the gate electrode. This makes it necessary for the drive circuit alternately to supply both positive and negative potentials for the gate electrode. A reversal of the charge carriers used, so that the programming is performed using hot holes and the erasure is performed using electrons injected from the channel, does not solve the problem either, owing to a lack of reliability due to defect sites produced by the hot holes.

Since, when using electrons for programming and hot holes for erasure, apart from the generation of a permanent electrical dipole, a complete compensation of the charges is not possible and the erasure process is therefore increasingly impaired, it is necessary, in order to increase the durability and reliability of the memory cell, to adapt the applied voltages in each case to the changed conditions as the number of programming/erasure cycles increases. However, this is possible only to a certain extent until finally the operating conditions become unsuitable on account of the required compensation for operation of the memory cell with this circuit.

SUMMARY OF THE INVENTION

In one aspect, the present invention specifies a possibility for eliminating the problem of inadequate erasure processes in the case of charge trapping memory cells.

In the case of the charge trapping memory cell, for the purpose of erasure, the electrons trapped in the storage layer during programming are removed through one of the boundary layers. Therefore, there is no need to inject any hot holes for compensation of the charge. The electrons may be withdrawn either into the semiconductor material, preferably into a source region or drain region, or toward the gate electrode from the storage layer. In order to make this possible, the storage layer sequence is suitably adapted to this erasure process. Since the electrons have to tunnel through one of the boundary layers, which usually occurs by Fowler-Nordheim tunneling, the materials and thicknesses of the layers of the storage layer sequence are selected correspondingly for this purpose.

When using a customary oxide-nitride-oxide layer sequence in which the two oxide layers constitute the lower and upper boundary layers and the nitride layer constitutes the actual storage layer, the upper oxide layer is preferably made somewhat thinner than the lower oxide layer. In this exemplary embodiment, the electrons localized in the storage layer during programming can be pulled toward the gate electrode through the thinner upper boundary layer by application of a positive electrical potential to the gate electrode.

A further, particularly preferred possibility consists in providing boundary layers made of $Al_2O_3$, which is more transmissive to electrons than to holes. This is due to the fact that the gaps between the conduction band and the valence band and the conduction band and the valence band, respectively, of the semiconductor material are different for the oxide and the $Al_2O_3$. The gap between the conduction band and the conduction band of silicon is 3.5 eV for $SiO_2$, 2.8 eV for $Al_2O_3$ and 2.4 eV for $Si_3N_4$. The gap between the valence band and the valence band of silicon is 4.3 eV for $SiO_2$, 4.9 eV for $Al_2O_3$ and 1.8 eV for $Si_3N_4$. When using boundary layers made of $Al_2O_3$, the discharge of the storage layer preferably occurs toward source or drain; both boundary layers may be chosen to have the same thickness. The advantage of the embodiment with $Al_2O_3$ is that the second bit programmed in the same memory cell is not impaired by the erasure process. If the memory cell is discharged toward the gate electrode during erasure, the information programmed in the second storage location of the memory cell has to be rewritten in a certain percentage of all cases.

BRIEF DESCRIPTION OF THE DRAWINGS

Examples of the memory cell and of the operating method are described in more detail below with reference to FIGS. 1 to 3.

FIG. 3 shows an energy diagram for the storage layer sequence.

The following list of reference symbols can be used in conjunction with the figures:

| | |
|---|---|
| 1 | Semiconductor body |
| 2 | Lower boundary layer |
| 3 | Storage layer |
| 4 | Upper boundary layer |
| 5 | Gate electrode |
| 6 | Insulation region |
| 7 | Insulation region |
| 8 | Arrow |
| 9 | Arrow |
| 10 | Arrow |
| 11 | Region |
| C | Channel region |
| D | Drain |
| S | Source |

DETAILED DESCRIPTION OF ILLUSTRATIVE EMBODIMENTS

Figure 1:
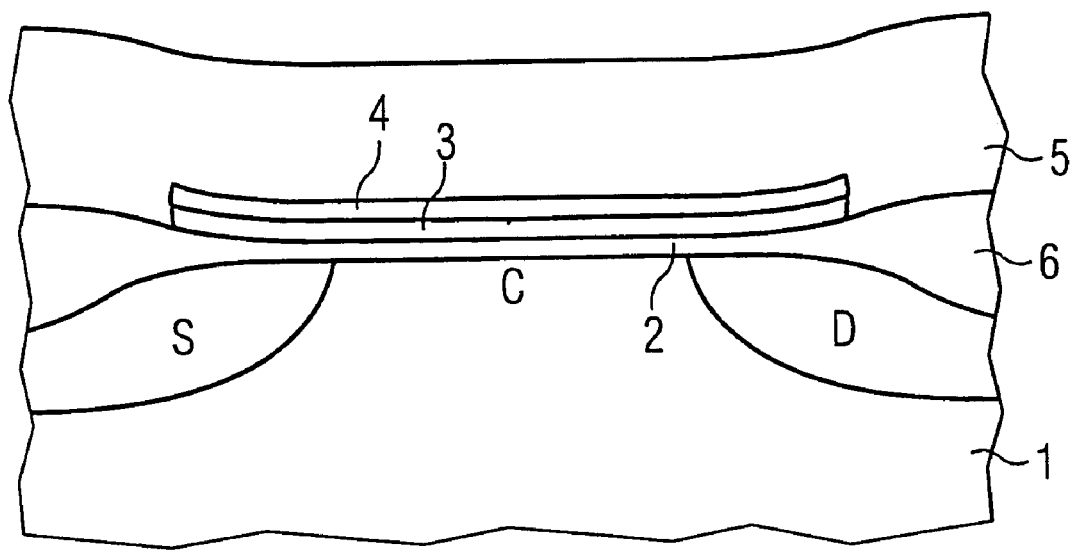
FIG. 1 shows a charge trapping memory cell in cross-section.

FIG. 1 shows a typical construction of an ONO charge trapping memory cell. Situated on a semiconductor body 1 or substrate, for example made of silicon, is a lower boundary layer 2, e.g., $SiO_2$, a storage layer 3, e.g., $Si_3N_4$, and an upper boundary layer 4, preferably made of the same material as the lower boundary layer 2. This storage layer sequence is covered by a gate electrode 5, which, in the example illustrated in FIG. 1, is part of a word line applied on the top side. Below the storage layer sequence, the channel region C is situated in the semiconductor body 1. This is adjoined by the regions of source S and drain D. Source S and drain D are covered by insulation regions 6 on the top side, which insulation regions may constitute a continuation of the lower boundary layer 2. The semiconductor material is for example thermally oxidized here. The storage layer 3 projects beyond portions of source S and drain D.

Figure 2:
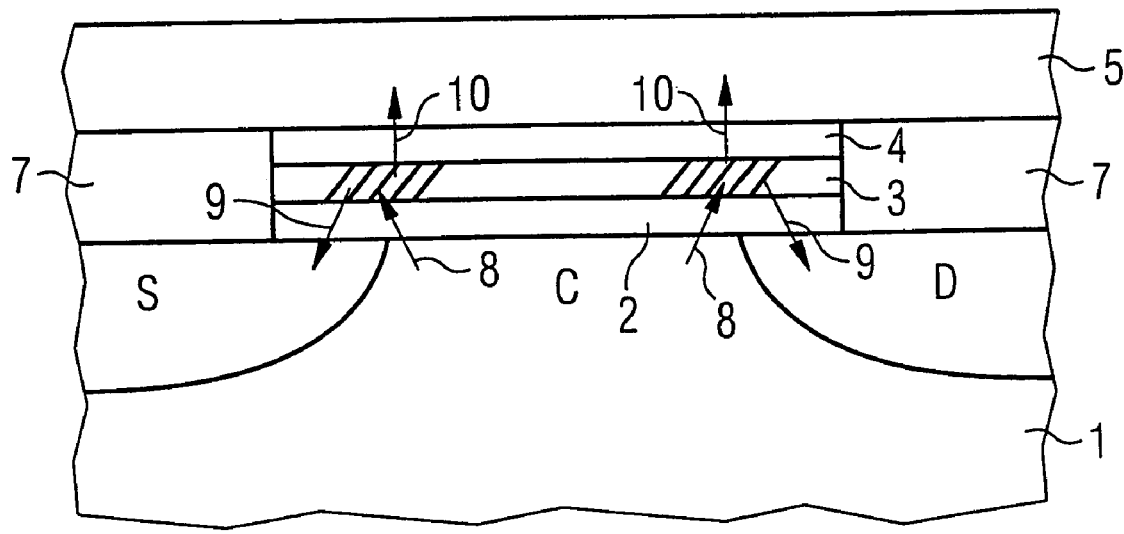
FIG. 2 shows a simplified illustration of a charge trapping memory cell in cross section for elucidating the programming process and the erasure process.

FIG. 2 shows a somewhat diagrammatic cross-section of a charge trapping memory cell for illustrating the processes of programming and erasure. This cross-section depicts, adjoining the storage layer sequence, insulation regions 7 between source S and drain D in the semiconductor body 1 and a word line with the gate electrode 5 on the topside. The lower boundary layer 2, the storage layer 3 and the upper boundary layer 4 are depicted with exaggerated thickness in the diagrammatic illustration of FIG. 2. The hatched regions in the storage layer 3 represent the regions in which electrons are trapped on the source side and drain side during programming. These electrons are accelerated by a potential difference between source and drain in the channel region C such that, shortly before reaching the region of source or drain, they have a sufficiently high energy in order to be able to overcome the potential threshold of the lower boundary layer 2 and accumulate at the hatched locations of the storage layer 3. FIG. 2 reveals that above source S and drain D there are two mutually separate storage regions for taking up an information bit. The direction of the electrons during the storage process is indicated by the arrows 8.

The erasure of the respective bits may be affected in the direction of the depicted arrows 9 toward source S and drain D; instead of this. It is possible to remove the electrons from the storage layer 3 toward the gate electrode 5 in accordance with the direction of the arrows 10. If the removal of the electrons toward the gate electrode is provided for erasure, the upper boundary layer 4 is preferably made thinner than the lower boundary layer 2. This facilitates the Fowler-Nordheim tunneling of the electrons through the upper boundary layer 4. Typical layer thicknesses are e.g. 7 nm for a lower boundary layer 2 made of $SiO_2$, 7 nm for a storage layer 3 made of $Si_3N_4$ and 5 nm for an upper boundary layer 4 made of $SiO_2$. For storing a bit programmed on the drain side, the following potentials are typically applied: 0 volts to source S, 4 volts to drain D and 9 volts to the gate electrode 5. During the erasure process, source and drain are at 0 volts, while 9 volts are present at the gate electrode. Owing to the lack of a potential difference between source and drain, no electrons are accelerated in the channel during erasure, so that no electrons pass from the channel through the thicker lower boundary layer into the storage layer and the electrons stored there flow away through the thinner upper boundary layer into the gate electrode. Estimations on the basis of measurements have revealed that approximately 80% of the charge carriers present in the storage layer have energies in the range of between 1.8 eV and 2.2 eV below the Fermi level of the nitrogen layer. As a result of this, the second stored bit may also be erased during this erasure process, which, on average, necessitates a reprogramming of these bits in approximately 12.5% of cases.

The alternative—illustrated in FIG. 2—for erasing the storage locations in the direction of the arrows 9 toward source S and drain D is preferably combined with a configuration of the charge trapping memory cells having a lower boundary layer 2 and an upper boundary layer 4 made of $Al_2O_3$. This material has the advantage that electrons can pass through it better than holes. This prevents an undesirable tunneling of holes into the storage layer. In this case, too, the mechanism during the erasure of the memory cell is preferably Fowler-Nordheim tunneling of the electrons from the storage layer through the lower boundary layer 2, so that there is no need for any compensation of the charge of the storage layer by injection of charge carriers of the opposite sign. In this embodiment, the storage layer 3 may be a nitride layer, for example, the typical thickness of which is, e.g., 7 nm. The boundary layers 2, 4 made of $Al_2O_3$ are typically 9 nm thick, for example. The electrical potentials that are to be applied for programming this memory cell correspond to those of the previous exemplary embodiment. In order to erase the bit programmed above source S or drain D, a voltage of typically approximately 12 volts is applied to the relevant region. The respective other region remains at floating potential, while the gate electrode remains grounded (0 volts). The bit that is not to be erased is preserved with this type of erasure process. This is an advantage of this exemplary embodiment of the memory cell and the associated erasure method.

FIG. 3 shows an energy diagram for a memory cell having boundary layers made of $SiO_2$ and a storage layer made of $Si_3N_4$ on a semiconductor body made of Si. The diagram depicts the energy level of the conduction band, on the left the energy level of the semiconductor made of silicon, in the middle the energy level of the storage layer sequence, and on the right the energy level of the gate electrode, which is, e.g., polysilicon. This diagram reveals that there is a jump in the energy level of the conduction band of 3.5 eV between the silicon of the semiconductor body and the lower boundary layer 2. There is a jump in the energy level of the conduction band of 0.7 eV between the lower boundary layer and the storage layer made of nitride. Lying approximately a further 2 eV below that are the energies of the stored electrons, the positions and energy levels of which lie approximately in the region 11 depicted in the diagram of FIG. 3. During the erasure process, the electrons are removed from region 11 by means of Fowler-Nordheim tunneling in accordance with the horizontal arrow depicted in FIG. 3 through the upper boundary layer toward the gate electrode.

What is claimed is:

1. A charge trapping memory cell, comprising:
   doped regions for source and drain formed at a distance from one another in a semiconductor body;
   a channel region formed in the semiconductor body between the source and the drain;
   a storage layer sequence comprising a lower boundary layer, a storage layer and an upper boundary layer located above the channel region and at least portions of the source and the drain; and
   a gate electrode arranged above the storage layer sequence wherein the storage layer sequence is formed by selection of the materials and the thicknesses of the lower boundary layer, of the storage layer and of the upper boundary layer such that a programming of the memory cell occurs by trapping of hot charge electron carriers from the channel region in the storage layer and an erasure of the memory cell occurs by removal of charge electron carriers from the storage layer by applying a positive potential to the gate electrode to pull the charge electron carriers into the gate electrode.

2. The charge trapping memory cell as claimed in claim 1 further comprising electrical potentials applied to the source and the drain, respectively, and the gate electrode, the potentials selected such that the charge carriers are accelerated in the direction from the source to the drain or from the drain to the source and are injected through the lower boundary layer into the storage layer.

3. The charge trapping memory cell as claimed in claim 1 further comprising electrical potentials applied to the source and the drain, respectively, and the gate electrode, the potentials selected such that the charge carriers are accelerated in the direction from the source to the drain or from the drain to the source and are injected through a tunneling of the charge carriers present in the storage layer through one of the boundary layers is effected.

4. The charge trapping memory cell as claimed in claim 1, wherein the memory cell is configured so that a Fowler-Nordheim tunneling of the charge carriers is provided during erasure.

5. The charge trapping memory cell as claimed in claim 1, wherein the upper boundary layer is thinner than the lower boundary layer.

6. The charge trapping memory cell as claimed in claim 1, wherein the lower boundary layer and the upper layer boundary layer comprise $Al_2O_3$.

7. A charge trapping memory cell, comprising:
   a semiconductor body;
   a first source/drain region disposed in the semiconductor body;
   a second source/drain region disposed in the semiconductor body and spaced from the first source/drain region;
   a channel region disposed in the semiconductor body between the first source/drain region and the second source/drain region;
   a lower boundary layer overlying the channel region and at least portions of the first and second source/drain regions, the lower boundary layer comprising aluminum and oxygen and having a first thickness;
   a storage layer overlying the lower boundary layer;
   an upper boundary layer overlying the storage layer, the upper boundary layer comprising aluminum end oxygen and having a second thickness, the second thickness being less than the first thickness, wherein materials and thicknesses of the lower boundary layer, of the storage layer, and of the upper boundary layer are selected such that a programming of the memory cell occurs by trapping of hot charge carriers of one sign from the channel region in the storage layer and an erasure of the memory cell occurs by removal of charge carriers of the same sign from the storage layer;
   a gate electrode arranged above the upper boundary layer; and
   electrical potentials coupled to the source region, the drain region and the gate electrode, to cause the charge carriers to be accelerated in the direction from the first source/drain region to the second source/drain region and to travel to the storage layer through the lower boundary layer during programming and to cause the carriers to be removed from the storage layer via the sate electrode.

8. The memory cell of claim 7 wherein electrical potentials cause the charge carriers to be injected through the lower boundary layer into the storage layer.

9. The memory cell of claim 7 wherein electrical potentials cause the charge carriers to be tunneled into the storage layer.

10. The memory cell of claim 9 wherein electrical potentials cause the charge carriers to be tunneled into the storage layer through the lower boundary layer.

11. The memory cell of claim 7 wherein the storage layer comprises silicon nitride.

12. The memory cell of claim 7 wherein the semiconductor body comprises a semiconductor substrate.

13. A charge trapping memory cell, comprising:
   doped regions for source and drain formed at a distance from one another in a semiconductor body;
   a channel region formed in the semiconductor body between the source and the drain;
   a storage layer sequence comprising a lower boundary layer, a storage layer and an upper boundary layer located above the channel region and at least portions of the source and the drain, wherein the lower boundary layer and the upper layer boundary layer comprise $Al_{O3}$; and
   a gate electrode ranged above the storage layer sequence wherein the storage layer sequence is formed by selection of the materials and the thicknesses of the lower boundary layer, of the storage layer and of the upper boundary layer such that a programming of the memory cell occurs by trapping of hot charge electron carriers from the channel region in the storage layer and an erasure of the memory cell occurs by removal of charge electron carriers from the storage layer.

14. The charge trapping memory cell as claimed in claim 13, wherein the erasure of the memory cell occurs by removal of charge electron carriers from the storage layer by applying a positive potential to the gate electrode to pull the charge electron carriers into the gate electrode.

15. The charge trapping memory cell as claimed in claim 14, further comprising electrical potentials applied to the source and the drain, respectively, and the gate electrode, the potentials selected such that the charge carriers are accelerated in the direction from the source to the drain or from the drain to the source and are injected through a tunneling of the charge carriers present in the storage layer through one of the boundary layers is effected.

16. The charge trapping memory cell as claimed in claim 14, further comprising electrical potentials applied to the source and the drain, respectively, and the gate electrode, the potentials selected such that the charge carriers are accelerated in the direction from the source to the drain or from the drain to the source and are injected through the lower boundary layer into the storage layer.

17. The charge trapping memory cell as claimed in claim 14, wherein the memory cell is configured so that a Fowler-Nordheim tunneling of the charge carriers is provided during erasure.

18. The charge trapping memory cell as claimed in claim 14, wherein the upper boundary layer is thinner than the lower boundary layer.

* * * * *

UNITED STATES PATENT AND TRADEMARK OFFICE
CERTIFICATE OF CORRECTION

PATENT NO. : 7,095,078 B2 Page 1 of 1
APPLICATION NO. : 10/954156
DATED : August 22, 2006
INVENTOR(S) : Verhoeven It is certified that error appears in the above-identified patent and that said Letters Patent is hereby corrected as shown below:

Column 6, line 41; delete "$Al_{O3}$" insert --$Al_2O_3$--

Signed and Sealed this

Twenty-eighth Day of November, 2006

JON W. DUDAS
*Director of the United States Patent and Trademark Office*